United States Patent [19]
Faltermeier et al.

[11] Patent Number: 6,150,670
[45] Date of Patent: Nov. 21, 2000

[54] PROCESS FOR FABRICATING A UNIFORM GATE OXIDE OF A VERTICAL TRANSISTOR

[75] Inventors: Johnathan E. Faltermeier, Lagrange; Ulrike Gruening, Wappingers Falls; Suryanarayan G. Hegde, New York; Rajarao Jammy, Wappingers Falls; Brian S. Lee, New York; Helmut H. Tews, Poughkeepsie, all of N.Y.

[73] Assignees: International Business Machines Corporation, Armonk, N.Y.; Infineon Technologies North America Corp., San Jose, Calif.

[21] Appl. No.: 09/450,546

[22] Filed: Nov. 30, 1999

[51] Int. Cl.$^7$ .................................................. H01L 27/108
[52] U.S. Cl. ......................... 257/77; 257/296; 257/301; 438/105; 438/931; 438/238
[58] Field of Search .................................. 257/77, 76, 75, 257/296, 297, 301, 302; 438/105, 931, 238, 239, 386, 399; 29/571

[56] References Cited

U.S. PATENT DOCUMENTS

| | | | |
|---|---|---|---|
| 4,397,075 | 8/1983 | Fatula, Jr. et al. | 29/571 |
| 4,503,601 | 3/1985 | Chaio | 29/571 |
| 4,990,462 | 2/1991 | Sliwa, Jr. | 437/51 |
| 5,075,253 | 12/1991 | Sliwa, Jr. | 437/209 |
| 5,670,805 | 9/1997 | Hammerl et al. | 257/301 |
| 5,744,826 | 4/1998 | Takeuchi et al. | 257/77 |
| 5,869,858 | 2/1999 | Ozawa et al. | 257/296 |

OTHER PUBLICATIONS

Doyle et al., "Simultaneous Growth of Different Thickness Gate Oxides in Silicon CMOS Processing," IEEE Electronic Device Letters, vol. 16, No. 7, pp. 301–302 (Jul. 1995).

Irene et al., "Silicon Oxidation Studies: Silicon Orientation Effects on Thermal Oxidation," J. Electrochem. Soc., vol. 133, No. 6, pp. 1253–1256 (Jun. 1986).

Primary Examiner—Charles Bowers
Assistant Examiner—Laura N. Schillinger
Attorney, Agent, or Firm—Ratner & Prestia; H. Daniel Schnurmann

[57] ABSTRACT

A process for fabricating a gate oxide of a vertical transistor. In a first step, a trench is formed in a substrate, the trench extending from a top surface of the substrate and having a trench bottom and a trench side wall. The trench side wall comprises a <100> crystal plane and a <110> crystal plane. Next, a sacrificial layer having a uniform thickness is formed on the trench side wall. Following formation of the sacrificial layer, nitrogen ions are implanted through the sacrificial layer such that the nitrogen ions are implanted into the <110> crystal plane of the trench side wall, but not into the <100> crystal plane of the trench side wall. The sacrificial layer is then removed and the trench side wall is oxidized to form the gate oxide.

9 Claims, 4 Drawing Sheets

PROCESS FOR FABRICATING A UNIFORM GATE OXIDE OF A VERTICAL TRANSISTOR

TECHNICAL FIELD

The present invention relates to a vertical transistor in a trench geometry. More particularly, this invention relates to a process for fabricating a gate oxide of a vertical transistor which has a uniform thickness.

BACKGROUND OF THE INVENTION

One of the consequences of the increased integration of transistors into the submicron regime is the decrease in the critical sizes of the transistors. An additional reduction of surface area is accomplished when the transistor is integrated in a vertical structure such as a trench or a stack. As the gate lengths are reduced, it becomes desirable to also reduce the thickness of the gate oxide as the simplest way to increase circuit speed. This is because, below about 0.5 $\mu$m, velocity saturation prevents a scaled increase in drive current as gate length decreases. For high speed and best device performance, it is also desirable to produce gate oxides having a homogenous thickness.

Gate oxides are typically formed by thermal oxidation of a silicon substrate. A crystal structure, such as silicon, contains planes of atoms. These planes of atoms influence the properties and behavior of the material. For example, the oxidation rate (R) of a silicon substrate depends on the crystal orientation of the silicon substrate.

Accordingly, it has proven advantageous to identify the various planes within crystals such as silicon crystals. This has been done, by convention, using three numbers within brackets called Miller indices. The Miller indices that define a lattice plane are simply the reciprocals (cleared of fractions and common multipliers) of the intercepts of the plane with the x, y, and z axes of a rectangular or Cartesian coordinate system. Thus, the <100> plane intercepts the x axis at one and has neither a y-axis intercept nor a z-axis intercept (the reciprocal of infinity is zero); the <100> plane is parallel to the y-z plane. Another example is the <110> plane, which intercepts both the x and y axes at one but has no z-axis intercept. The <110> plane meets both the x-z plane and the y-z plane at a forty-five degree angle. Note, too, that the <110> plane intercepts the <100> plane at a forty-five degree angle.

As stated above, it is known that the thermal oxidation rate (R) of a silicon substrate depends on the crystal orientation of the silicon substrate. More specifically, at the oxidation temperatures of interest, the oxidation rate for a <110> silicon surface orientation is faster than the rate for a <100> silicon surface orientation ($R_{<110>} > R_{<100>}$).

See E. Irene et al., "Silicon Oxidation Studies: Silicon Orientation Effects on Thermal Oxidation," J. Electrochem. Soc'y 1253 (June 1986). FIG. 8 illustrates the conventional result: a thicker gate oxide 30 forms on the <110> crystal plane than on the <100> crystal plane and the oxide thickness is non-uniform.

It is also known that the introduction of nitrogen ions into a silicon substrate reduces the oxidation rate of the silicon substrate which has been implanted with the nitrogen ions. For example, in their article titled "Simultaneous Growth of Different Thickness Gate Oxides in Silicon CMOS Processing" (IEEE Electron Device Letters, Vol. 16, No. 7, July 1995), Doyle et al. provide a process for implanting nitrogen ions into a planar silicon wafer to simultaneously form gate oxides of varying thickness on the wafer.

Unfortunately, the process of Doyle et al. does not address the need to form a gate oxide of a non-planar transistor having a substantially uniform thickness. In non-planar structures (i.e., those structures that do not present a completely uniform, uninterrupted, flat silicon surface), such as vertical trench or mesa structures, the silicon substrate consists of multiple crystal planes. Each of the crystal planes has a different oxidation rate. As a result, when the silicon substrate is oxidized to produce the gate oxide, the resulting gate oxide has a varying thickness corresponding to the different crystal planes. Therefore, there remains a need for a process of forming a gate oxide of substantially uniform thickness on non-planar structures.

SUMMARY OF THE INVENTION

To meet this and other needs, and in view of its purposes, the present invention provides a process of forming relatively thin gate oxides of substantially uniform thickness on non-planar structures. The invention more specifically provides a process for fabricating a gate oxide of a vertical transistor which has a substantially uniform thickness. In a first step of the process of the invention, a trench is formed in a substrate. The trench extends from a surface of the substrate and has a trench bottom and a trench side wall. The vertical trench side wall comprises <100> crystal planes and <110> crystal planes. Next, a sacrificial layer having a uniform thickness is formed on the trench side wall. Following formation of the sacrificial layer, nitrogen ions are implanted through the sacrificial layer into the <110> crystal plane of the trench side wall, with the condition that the nitrogen ions are not implanted into the <100> crystal plane of the trench side wall. The sacrificial layer is then removed and the trench side wall is oxidized to form the gate oxide.

The present invention also encompasses the product of the process outlined above. Specifically, the invention provides a vertical transistor having a uniform and relatively thin gate oxide prepared by the foregoing process.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The invention will next be described with reference to the figures in which the same numbers indicate the same elements in all figures. Such figures are intended to be illustrative, rather than limiting, and are included to facilitate the explanation of the process and product of the present invention.

Figure 1:
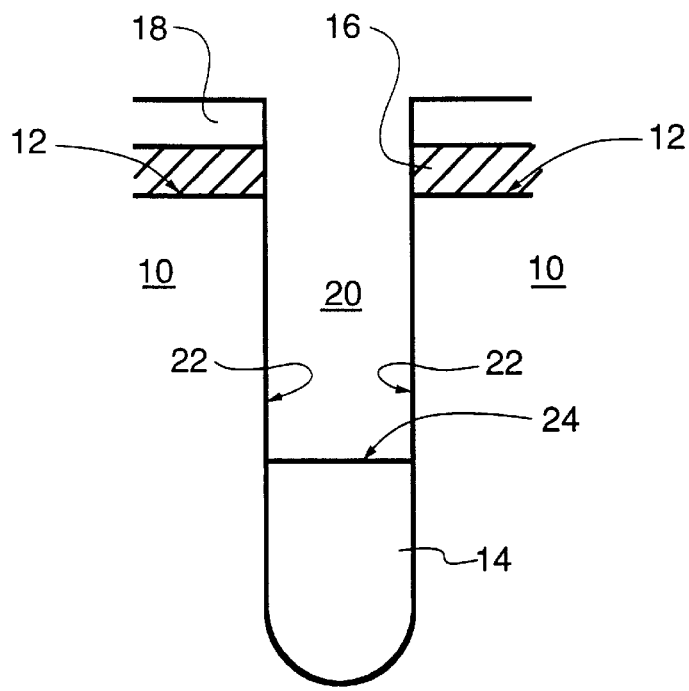
FIG. 1 shows a cross-sectional view of a trench formed in a substrate.

The process of the invention begins by forming a trench 20 in a substrate 10. The substrate 10 is composed of silicon and can also include one or more layers disposed on a surface 12 of the substrate 10, such as a silicon nitride layer 16, a silicon oxide layer 18, or both. The resulting structure is illustrated in FIG. 1. As shown in FIG. 1, the trench 20 extends downward from the surface 12 of the substrate 10 and includes a trench side wall 22 and a trench bottom 24. In addition, a polysilicon layer 14 may be disposed below the bottom 24 of the trench 20. A polysilicon layer 14, such as that illustrated in FIG. 1, is conventionally formed at the bottom of vertical structures. The trench 20 is formed using techniques that are well known to those of ordinary skill in the art, such as standard photomasking and etching.

Figure 2:
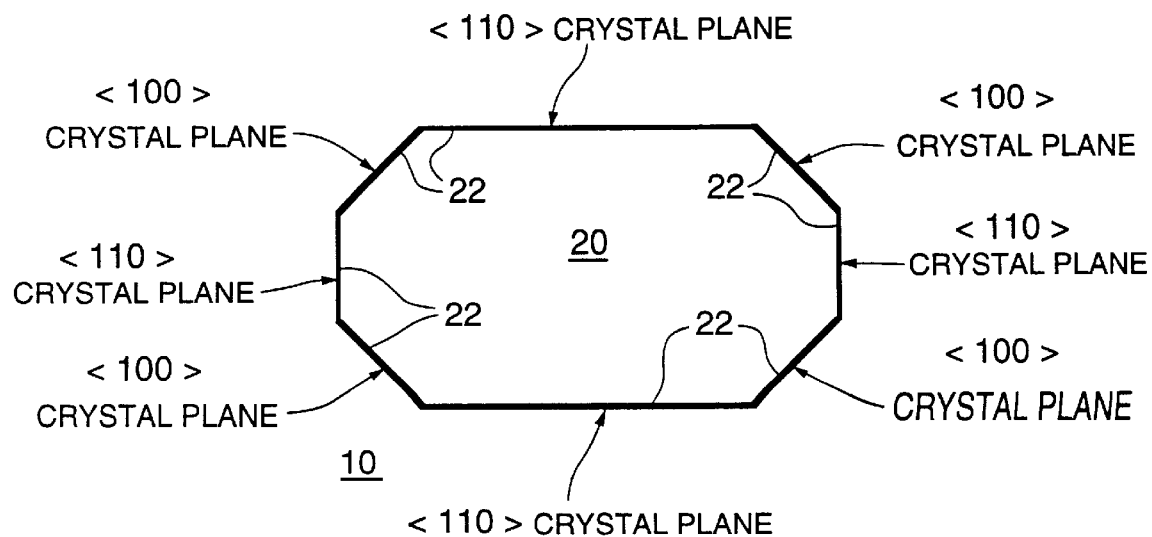
FIG. 2 shows a top down cross-sectional view of the trench illustrated in FIG. 1, the side wall having four <100> crystal planes and four <110> crystal planes.

FIG. 2 shows a top down cross-sectional view of the trench 20 illustrated in FIG. 1. Non-planar structures, such as the trench 20 illustrated in FIG. 2, contain multiple crystal planes. The trench side wall 22 illustrated in FIG. 2 has four <100> crystal planes and four <110> crystal planes.

Figure 3:
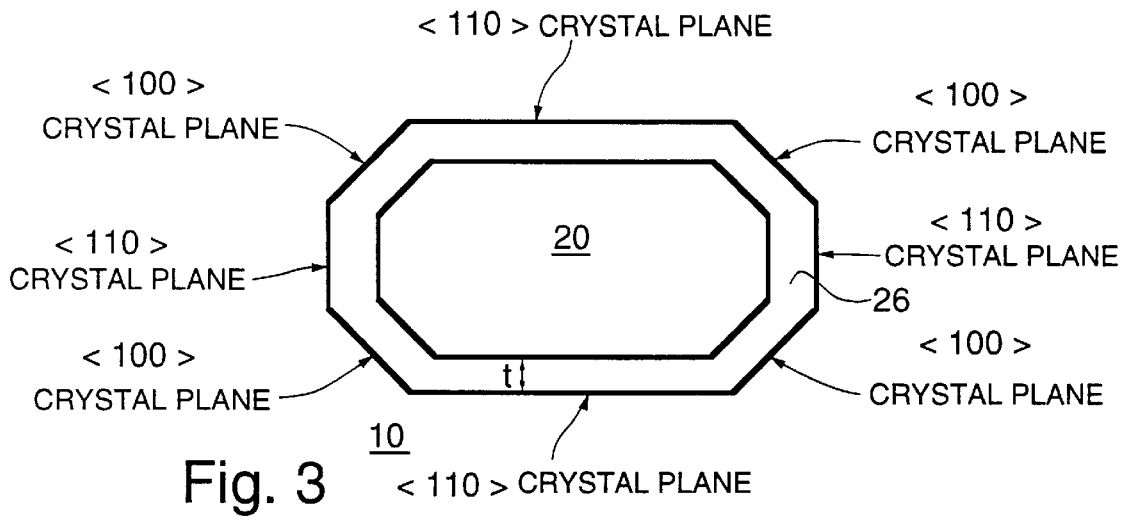
FIG. 3 shows the trench illustrated in FIG. 2 having a sacrificial layer formed on the side wall of the trench.

Following the formation of the trench 20, the next step of the process of the present invention is applied to the structure illustrated in FIG. 1. That step comprises forming a sacrificial layer 26 on the trench side wall 22. The resulting structure is illustrated in FIG. 3.

The sacrificial layer 26 is formed on the trench side wall 22 such that the sacrificial layer 26 has a uniform thickness. The uniform thickness is shown in FIG. 3 as the thickness "t". Preferably, the sacrificial layer 26 has a thickness of from about 3 nm to about 10 nm. The sacrificial layer 26 can be formed using techniques that are well known to those of ordinary skill in the art. Preferably, the sacrificial layer 26 is a deposited dielectric material formed using the high density plasma technique. A trench bottom oxide layer (shown in FIG. 5 as trench bottom oxide layer 28) can also be formed on the trench bottom 24.

Following formation of the sacrificial layer 26, in the next step of the process of the present invention nitrogen ions are implanted through the sacrificial layer 26 and into the <110> crystal plane of the trench side wall 22. This step is performed while specifically excluding nitrogen ion implantation into the <100> crystal plane of the trench side wall 22. The nitrogen ion implantation is shown in FIG. 4 along the arrows labeled "NI" for "nitrogen ions."

Due to the characteristics of varying crystal planes, the <110> crystal plane of the trench side wall 22 has a greater oxidation rate than the <100> crystal plane of the trench side wall 22. As a result, when the trench side wall 22 is oxidized to form the gate oxide using conventional processes, the thickness $t_1$ of the gate oxide formed on the <110> crystal plane is greater than the thickness $t_2$ of the gate oxide formed on the <100> crystal plane of the trench side wall 22. It has been discovered that implanting nitrogen ions into the <110> crystal plane of the trench side wall 22 preferentially reduces the oxidation rate on the <110> crystal plane. By purposefully excluding nitrogen ion implantation into the <100> crystal plane of the trench side wall 22, a gate oxide having a substantially uniform or homogenous thickness can be fabricated.

Figure 4:
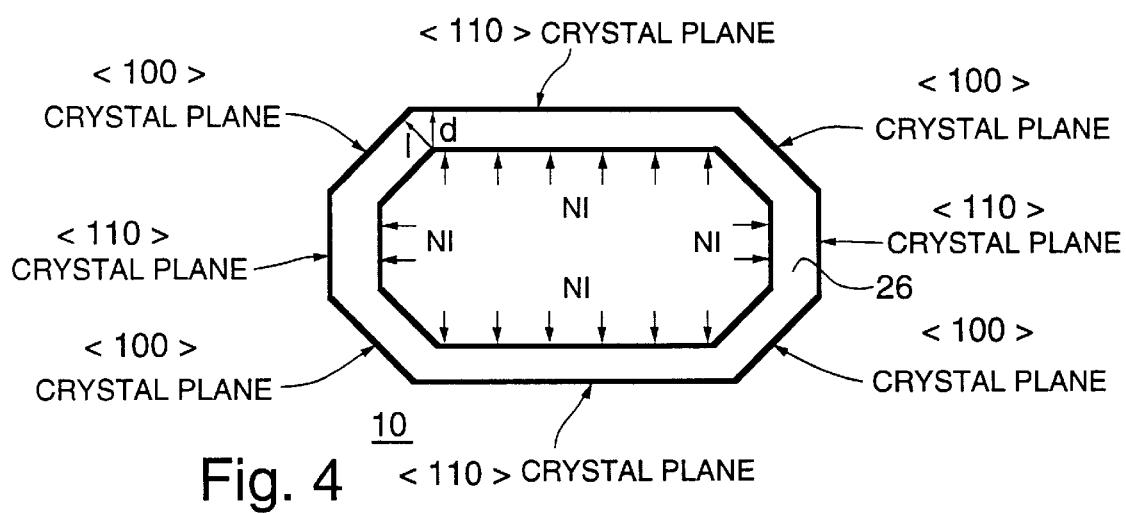
FIG. 4 shows the trench illustrated in FIG. 3 wherein nitrogen ions are implanted through the sacrificial layer in the direction of the four <110> crystal planes.

Referring to FIG. 4, a comparison of the travel path of nitrogen ions through the sacrificial layer 26 to the <100> crystal planes and to the <110> crystal planes can be expressed by the equation:

$$\cos 45° = d/1 \text{ or } 0.7 \times 1 = d \text{ or } 1 = 1.4 \times d$$

wherein "d" is the length of travel of the nitrogen ions through the sacrificial layer 26 to the <110> crystal plane and "1" is the length of travel of the nitrogen ions through the sacrificial layer 26 to the <100> crystal plane. Because the <110> crystal plane is oriented at an angle of forty-five degrees relative to the <100> crystal plane, the travel path length of the nitrogen ions through the sacrificial layer 26 to the <100> crystal plane is 1.4 times the length of the travel path of the nitrogen ions to the <110> crystal plane. It has been discovered that nitrogen ions can be implanted through the sacrificial layer 26 and into the <110> crystal plane such that the nitrogen ions are not implanted into the <100> crystal plane of the trench side wall 22.

The nitrogen ions are implanted through the sacrificial layer 26 and into the trench side wall 22 at an angle α relative to the top surface 12 of the substrate 10.

Figure 5:
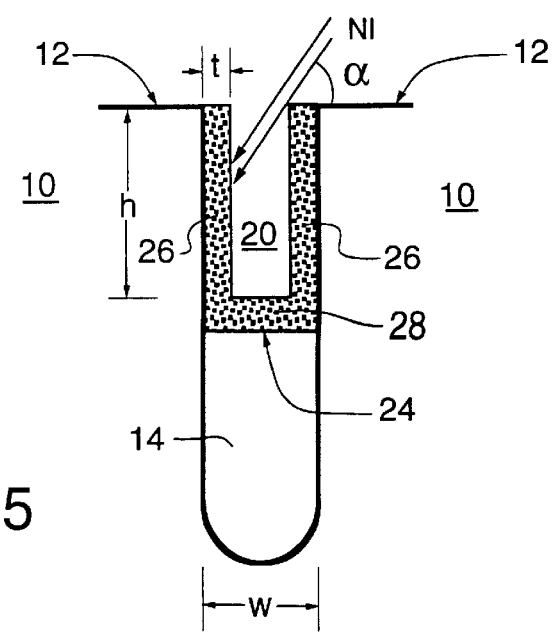
FIG. 5 shows a cross sectional view of the structure illustrated in FIG. 4.

Referring to FIG. 5, the angle α of implantation can be calculated by:

$$\alpha = \tan^{-1}(h/w)$$

where "h" is the height of the trench 20 and "w" is the width of the trench 20. Preferably, the angle α is from about 10 degrees to about 60 degrees relative to the top surface 12 of the substrate 10. Even more preferably, the angle α is between about 30 degrees to about 40 degrees.

Figure 6:
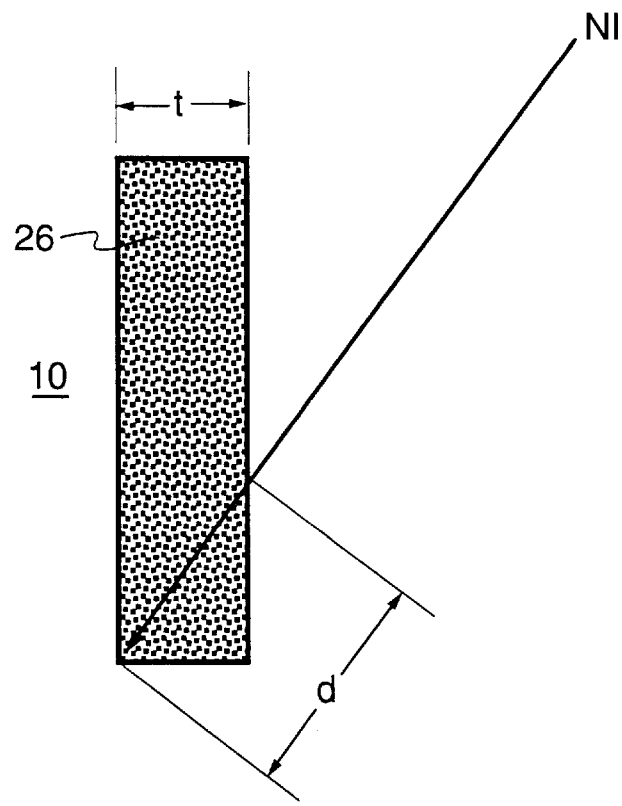
FIG. 6 shows a cross-sectional view of the sacrificial layer and trench side wall illustrated in FIG. 5.

Referring to FIG. 6, the path "d" of the nitrogen ions through the sacrificial layer 26 to the <110> plane can be expressed by the equation:

$$d = t/\sin \alpha$$

wherein "t" is the thickness of the sacrificial layer 26 and "α" is the angle of nitrogen ion implantation with respect to the top surface 12 of the substrate 10. The nitrogen ion implantation energy necessary to implant the nitrogen ions into the <110> crystal plane, while excluding the implantation of nitrogen ions into the <100> crystal plane (because the nitrogen ions will have sufficient energy to pass through the sacrificial layer 26 the distance d to the <110> crystal plane but insufficient energy to pass through the sacrificial layer 26 the greater distance 1 to the <100> crystal plane), can be expressed by the equation:

$$E_{implantation} \leq (1.4)(E_{min}),$$

wherein $E_{min}$ is the energy necessary to implant the nitrogen ions just through the sacrificial layer 26, but not into the trench side wall 22, and $E_{implantation}$ is the energy of nitrogen ion implantation. The nitrogen ions are preferably implanted at a dose from about $2 \times 10_{14}/cm^2$ to about $1 \times 10^{15}/cm^2$.

Figure 7:
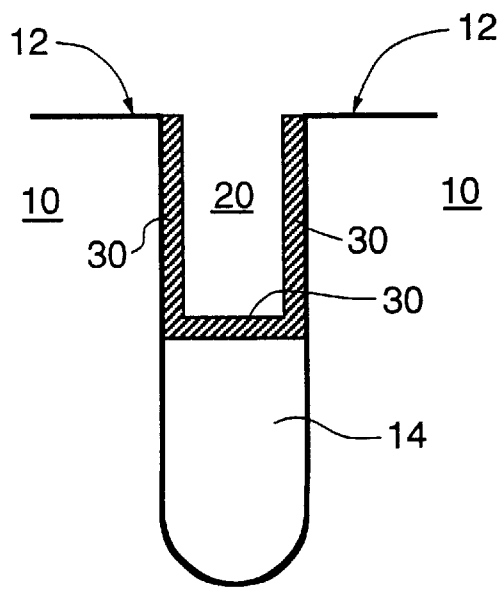
FIG. 7 shows a cross-sectional view of a gate oxide formed on the trench side wall illustrated in FIG. 1.
Figure 8:
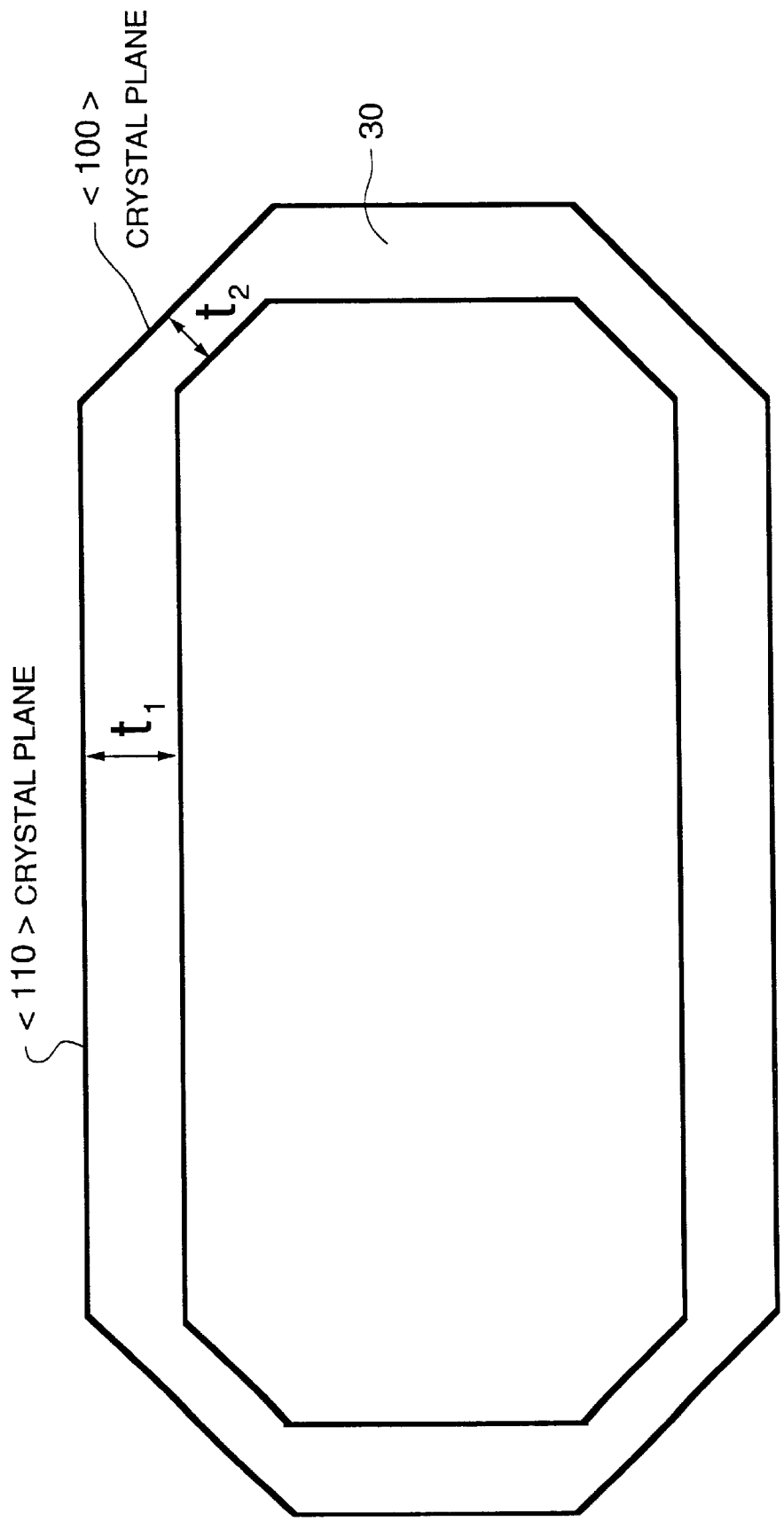
FIG. 8 shows a top down cross-sectional view of a conventional capacitor trench illustrating oxide thickness dependence on crystal plane orientation.

Following nitrogen ion implantation, the next step of the invention comprises removing the sacrificial layer 26 from the trench side wall 22. The sacrificial layer 26 can be removed using techniques that are well known to those of ordinary skill in the art. The trench side wall 22 is then oxidized, preferably by thermal oxidation, to produce a gate oxide 30 having a substantially uniform or homogenous thickness. The resulting structure is illustrated in FIG. 7. The thickness of the gate oxide 30 is relatively thin and may be on the order of about 50 Å when oxidation is performed at about 800° C.

Following oxidation of the trench side wall 22 to form the gate oxide 30, conventional processes can be used to complete the processing of the vertical transistor.

Although illustrated and described above with reference to specific embodiments, the present invention is nevertheless not intended to be limited to the details shown. Rather, various modifications may be made in the details within the scope and range of equivalents of the claims and without departing from the spirit of the invention.

What is claimed is:

1. A vertical transistor prepared by a process comprising the steps of:

forming a trench in a substrate, said trench extending from a top surface of said substrate and having a trench bottom and a trench side wall, said trench side wall including a <100> crystal plane and a <110> crystal plane;

forming a sacrificial layer on said trench side wall, said sacrificial layer having a uniform thickness;

implanting nitrogen ions through said sacrificial layer into the <110> crystal plane of said trench side wall without implanting said nitrogen ions into the <100> crystal plane of said trench side wall;

removing said sacrificial layer; and oxidizing said trench side wall to form said gate oxide.

2. The vertical transistor of claim 1 wherein the step of forming the sacrificial layer on said trench side wall comprises depositing a dielectric material by a high density plasma technique.

3. The vertical transistor of claim 1 wherein said sacrificial layer has a uniform thickness from about 3 nm to about 10 nm.

4. The vertical transistor of claim 1 wherein said nitrogen ions are implanted at an angle α relative to the top surface of said substrate, said angle α being calculated by:

$$\tan^{-1}(h/w)$$

wherein h is the height of said trench and w is the width of said trench.

5. The vertical transistor of claim 4 wherein said angle α is from about 10 degrees to about 60 degrees.

6. The process of claim 4 wherein said nitrogen ions are implanted at an energy calculated by:

$$E_{implantation} \leq (1.4)(E_{min})$$

wherein $E_{min}$ is the energy necessary to implant the nitrogen ions just through said sacrificial layer without implanting said nitrogen ions into said trench side wall and $E_{implantation}$ is the energy of nitrogen ion implantation.

7. The vertical transistor of claim 1 wherein said nitrogen ions are implanted at a dose of about $2\times10^{14}/cm^2$ to about $1\times10^{15}/cm^2$.

8. The vertical transistor of claim 1 wherein said substrate comprises a silicon wafer and a silicon nitride layer disposed on said silicon wafer.

9. The vertical transistor of claim 8 wherein said substrate further comprises an oxide layer disposed on said silicon nitride layer.

* * * * *